United States Patent
Nishino et al.

(10) Patent No.: US 10,616,517 B2
(45) Date of Patent: Apr. 7, 2020

(54) IMAGING APPARATUS

(71) Applicant: FUJITSU LIMITED, Kawasaki-shi, Kanagawa (JP)

(72) Inventors: Hironori Nishino, Isehara (JP); Yasuo Matsumiya, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 137 days.

(21) Appl. No.: 15/645,143

(22) Filed: Jul. 10, 2017

(65) Prior Publication Data
US 2018/0035065 A1 Feb. 1, 2018

(30) Foreign Application Priority Data
Jul. 27, 2016 (JP) .................................. 2016-147782

(51) Int. Cl.
*H04N 5/374* (2011.01)
*H04N 5/3745* (2011.01)
(Continued)

(52) U.S. Cl.
CPC ..... *H04N 5/3742* (2013.01); *H01L 27/14612* (2013.01); *H01L 27/14625* (2013.01);
(Continued)

(58) Field of Classification Search
CPC ....................................................... H04N 5/33
See application file for complete search history.

(56) References Cited

U.S. PATENT DOCUMENTS

| 4,608,599 A | * | 8/1986 | Kaneko | H04N 5/332 348/164 |
| 4,659,928 A | * | 4/1987 | Tew | H04N 5/33 250/330 |

(Continued)

FOREIGN PATENT DOCUMENTS

| JP | 2009-141612 A1 | 6/2009 |
| JP | 2011-142558 A1 | 7/2011 |

OTHER PUBLICATIONS

Office Action of corresponding Japanese Patent Application No. 2016-147782 dated Jan. 14, 2020 (6 sheets, 4 sheets translation, 10 sheets total).

*Primary Examiner* — Pankaj Kumar
*Assistant Examiner* — Timothy R Newlin
(74) *Attorney, Agent, or Firm* — Kratz, Quintos & Hanson, LLP

(57) ABSTRACT

An imaging apparatus includes an image sensor including a common sensor element, the common sensor element having a plurality of output systems therefrom, and a signal processing circuit that generates an image signal from outputs of the image sensor, wherein the plurality of output systems individually include a transistor, a capacitor that stores charge in accordance with a current flowing through the sensor element via the transistor, and output circuitry that outputs a sensor signal in accordance with a voltage of the capacitor, wherein the transistors individually allow the current to flow in time periods different with each other, and the signal processing circuit does not use the sensor signals if the sensor signals do not match with each other, and the signal processing circuit uses the sensor signals for generating the image signal if the sensor signals match with each other.

3 Claims, 18 Drawing Sheets

(51) Int. Cl.
*H01L 27/146* (2006.01)
*H04N 5/33* (2006.01)
*H04N 5/378* (2011.01)

(52) U.S. Cl.
CPC ......... *H01L 27/14649* (2013.01); *H04N 5/33* (2013.01); *H04N 5/378* (2013.01); *H04N 5/3745* (2013.01)

(56) References Cited

U.S. PATENT DOCUMENTS

| | | | | |
|---|---|---|---|---|
| 4,831,257 A * | 5/1989 | McClelland | | G01J 5/30 250/332 |
| 4,967,276 A * | 10/1990 | Murakami | | H04N 5/265 250/330 |
| 5,013,919 A * | 5/1991 | Solomon | | G08B 13/194 250/349 |
| 5,589,876 A * | 12/1996 | Konuma | | H04N 5/33 250/332 |
| 6,011,257 A * | 1/2000 | Endoh | | H04N 5/33 250/252.1 |
| 6,230,108 B1 * | 5/2001 | Matsuda | | G01J 5/524 250/208.1 |
| 9,431,441 B1 * | 8/2016 | Zhou | | H01L 27/14612 |
| 2002/0159101 A1 * | 10/2002 | Alderson | | H04N 5/33 358/504 |
| 2003/0198400 A1 * | 10/2003 | Alderson | | H04N 5/361 382/274 |
| 2006/0097965 A1 * | 5/2006 | Deane | | G09G 3/3233 345/76 |
| 2007/0145274 A1 * | 6/2007 | Iida | | G01J 1/46 250/338.4 |
| 2009/0079854 A1 * | 3/2009 | Mangoubi | | G06T 5/50 348/251 |
| 2009/0257679 A1 * | 10/2009 | Hogasten | | G06T 5/50 382/275 |
| 2010/0140455 A1 * | 6/2010 | Nathan | | G01D 5/24 250/214 A |
| 2011/0001830 A1 * | 1/2011 | Egashira | | G01J 5/08 348/164 |
| 2013/0250125 A1 * | 9/2013 | Garrow | | H04N 5/3658 348/164 |
| 2015/0319378 A1 * | 11/2015 | Hoelter | | H04N 5/2257 348/164 |
| 2017/0088098 A1 * | 3/2017 | Frank | | G06K 9/00362 |
| 2017/0163884 A1 * | 6/2017 | Kobayashi | | G01J 1/12 |

* cited by examiner

IMAGING APPARATUS

CROSS-REFERENCE TO RELATED APPLICATION

This application is based upon and claims the benefit of priority of the prior Japanese Patent Application No. 2016-147782, filed on Jul. 27, 2016, the entire contents of which are incorporated herein by reference.

FIELD

The embodiments discussed herein are related to an imaging apparatus.

BACKGROUND

An infrared imaging apparatus using an infrared image sensor is known as an imaging apparatus. An infrared imaging apparatus using an infrared image sensor has a characteristic of capable of measuring temperature contactlessly, and thus is used for applications, such as security, medical care, maintenance, research and development, military affairs, and the like. For example, an infrared imaging apparatus is used for contactlessly measuring the temperature of passengers at an airport and to extract patients of infectious diseases. Also, an infrared imaging apparatus is sometimes used for a night vision device. In the following, a description will be given of an example of an infrared imaging apparatus using an infrared imaging device. However, the described technique is not limited to this case.

FIG. 1 is a diagram illustrating an example of the configuration of an infrared imaging apparatus 1 using an infrared image sensor 14. The infrared imaging apparatus 1 includes an imaging unit 10 and a signal processing circuit 18 that performs signal processing on the infrared imaging signal output from the imaging unit 10. The imaging unit 10 includes a lens 11 and an infrared image sensor 14. The signal processing circuit 18 includes a sensitivity correction calculation circuit 16 and an imaging circuit 15.

FIG. 2 is a diagram illustrating an example of a configuration of the infrared image sensor 14. The infrared image sensor 14 detects the infrared light emitted from an observation object in accordance with the surface temperature of the observation object by a plurality of sensor elements disposed in a two-dimensional array. The infrared image sensor 14 then outputs a sensor output signal in order to generate a thermal image (thermographic image) indicating the distribution of the surface temperature of the observation object.

The infrared image sensor 14 includes a sensor array 12 and a complementary metal oxide semiconductor (CMOS) reading circuit 13. The CMOS reading circuit 13 is disposed on a substrate. The corresponding electrodes of the sensor array 12 and the CMOS reading circuit 13 are coupled by bumps 17 that are made of indium. The sensor array 12 includes a plurality of sensor elements (pixels) that are disposed in a two-dimensional array. Each sensor element of the sensor array 12 is a photoconductive element having a characteristic of changing the resistance value in accordance with the amount of incident infrared light.

The lens 11 (refer to FIG. 1) projects the infrared light emitted from the observation object onto the sensor array 12. Each sensor element of the sensor array 12 generates a photoelectric current in accordance with the amount of the incident infrared light that is projected. Thereby, the infrared light is converted to an electronic signal. The electronic signal is multiplexed by the CMOS reading circuit 13 and then is output to the sensitivity correction calculation circuit 16 of the signal processing circuit 18. The imaging circuit 15 performs format conversion on the infrared imaging signal after the sensitivity correction processing by the sensitivity correction calculation circuit 16 into an image signal for generating a thermal image. A display monitor not illustrated in FIG. 1 displays a thermal image based on the image signal output from the imaging circuit 15.

FIG. 3 is a diagram illustrating an example of a configuration of the CMOS reading circuit 13. The CMOS reading circuit 13 includes a plurality of pixel circuits 21 and a scan circuit 25.

The scan circuit 25 includes a plurality of scan lines 27 that extend in parallel in the horizontal direction (row direction), a plurality of vertical bus lines 28 that extend in parallel in the vertical direction (column direction), a vertical scanning shift register 22, and a horizontal scanning shift register 23.

The pixel circuits 21 are disposed in a matrix state correspondingly to the individual intersecting units of the plurality of scan lines 27 and the plurality of vertical bus lines 28. A sensor element 24 in a pixel circuit 21 indicates a sensor element (cell) disposed in the sensor array 12 (refer to FIG. 2), which is a photosensitive unit of the infrared image sensor 14. The pixel circuit 21 is disposed for each of the plurality of sensor elements 24.

In the pixel circuit 21, a reset signal RS is applied to a transistor 36 for a reset gate, and thus the transistor 36 becomes conductive so that a storage capacitor 41 is charged at a predetermined value. After the application of the reset signal RS is stopped, an integration signal IG-T2 is applied to a transistor 35 for an input gate for a certain period of time, a current corresponding to the infrared light intensity flows through the sensor element 24, and thus the voltage of the storage capacitor 41 becomes a voltage corresponding to the infrared light intensity. Next, a transistor 37 for sample-and-hold reset becomes conductive in response to a reset signal SHRS, and thus the voltage level of a sample-and-hold capacitor 42 is reset to a predetermined value. Next, sample-and-hold signals SH and /SH are applied to a transfer gate 38, and thus the voltage of the storage capacitor 41 is transferred to the sample-and-hold capacitor 42 and held. The sample-and-hold signal /SH is the inverted signal of the sample-and-hold signal SH. Such an operation is individually performed in the plurality of pixel circuits 21 at the same time, and thus a voltage corresponding to the infrared light intensity of each sensor element 24 is held in each sample-and-hold capacitor 42.

The vertical scanning shift register 22 outputs a scan pulse V-Sel that selects a plurality of scan lines 27 one by one in sequence. A transistor 32 whose gate is coupled to a scan line 27 to which the scan pulse V-Sel is output becomes conductive in accordance with the scan pulse V-Sel. The voltage held by the sample-and-hold capacitor 42 of the pixel circuit 21 coupled to the conductive transistor 32 via the transistor 31 is individually output to the corresponding vertical bus line 28 via the transistor 31 and the transistor 32.

The horizontal scanning shift register 23 applies a reading pulse H-Sel to a transistor 33 in sequence. In response to the reading pulse H-Sel, the voltage of the vertical bus line 28 is output to a reading line 26, and an image signal voltage Vpxl arises. The image signal voltage Vpxl is out from a final output stage amplifier 29 as an analog output signal Vout in sequence.

When the output of the voltage of all the vertical bus lines 28 is complete, the vertical scanning shift register 22 applies the scan pulse V-Sel to the next scan line 27. After that, the above-described operations are repeated, and the signals of all the sensor elements 24 that are two-dimensionally disposed are multiplexed and output on one output line. A transistor 34 becomes conductive in response to a signal VRS and resets the reading line 26 to a ground level.

A timing control signal that operates the CMOS reading circuit 13, such as the reset signal RS, or the like is given from the timing generator 20.

However, if there is a charge trap on the gate electrode interface of a CMOS transistor, the channel potential of the transistor gets out of order by the existence of an electron that comes in and out from the trap. FIG. 4 is a diagram illustrating a part of a configuration of the pixel circuit. When the channel potential of the transistor 35 for an input gate gets out of order due to a charge trap, even if the voltage given to the gate of the transistor 35 from the outside is kept as a fixed voltage, the gate-to-source voltage of the transistor 35 changes, and thus the source potential of the transistor 35 changes. Changes in the source potential of the transistor 35 cause fluctuations of the bias voltage applied to the both ends of the sensor element 24, which brings about fluctuations of the photoelectric current that occurs in the sensor element 24. Accordingly, the amount of charge stored in the storage capacitor 41 and transferred to the sample-and-hold capacitor 42 fluctuates. Accordingly, the pixel output voltage read from the pixel circuit 21 fluctuates with time in accordance with a temporal change of the trap state of the transistor 35 in the input gate unit.

The fluctuations of the pixel output voltage often appear as binary fluctuations having a relatively large amplitude as illustrated in FIG. 5, and are referred to as random telegraph noise. FIG. 5 is a diagram illustrating an example of fluctuations of a pixel output voltage. In FIG. 5, a pixel output voltage for a certain pixel circuit is expressed by continuous data that is arranged continuously on the time axis. If fluctuations of the pixel output voltage for a certain pixel continues as illustrated in FIG. 5, the luminance corresponding to the pixel changes on the display monitor with time, and thus an image on the display monitor might be disordered.

The following is a reference document.

[Document 1] Japanese Laid-open Patent Publication No. 2011-142558.

SUMMARY

According to an aspect of the invention, an imaging apparatus includes an image sensor including a common sensor element, the common sensor element having a plurality of output systems therefrom, and a signal processing circuit that generates an image signal from outputs of the image sensor, wherein the plurality of output systems individually include a transistor, a capacitor that stores charge in accordance with a current flowing through the sensor element via the transistor, and output circuitry that outputs a sensor signal in accordance with a voltage of the capacitor, wherein the transistors individually allow the current to flow in time periods different with each other, and the signal processing circuit does not use the sensor signals if the sensor signals do not match with each other, and the signal processing circuit uses the sensor signals for generating the image signal if the sensor signals match with each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 6:
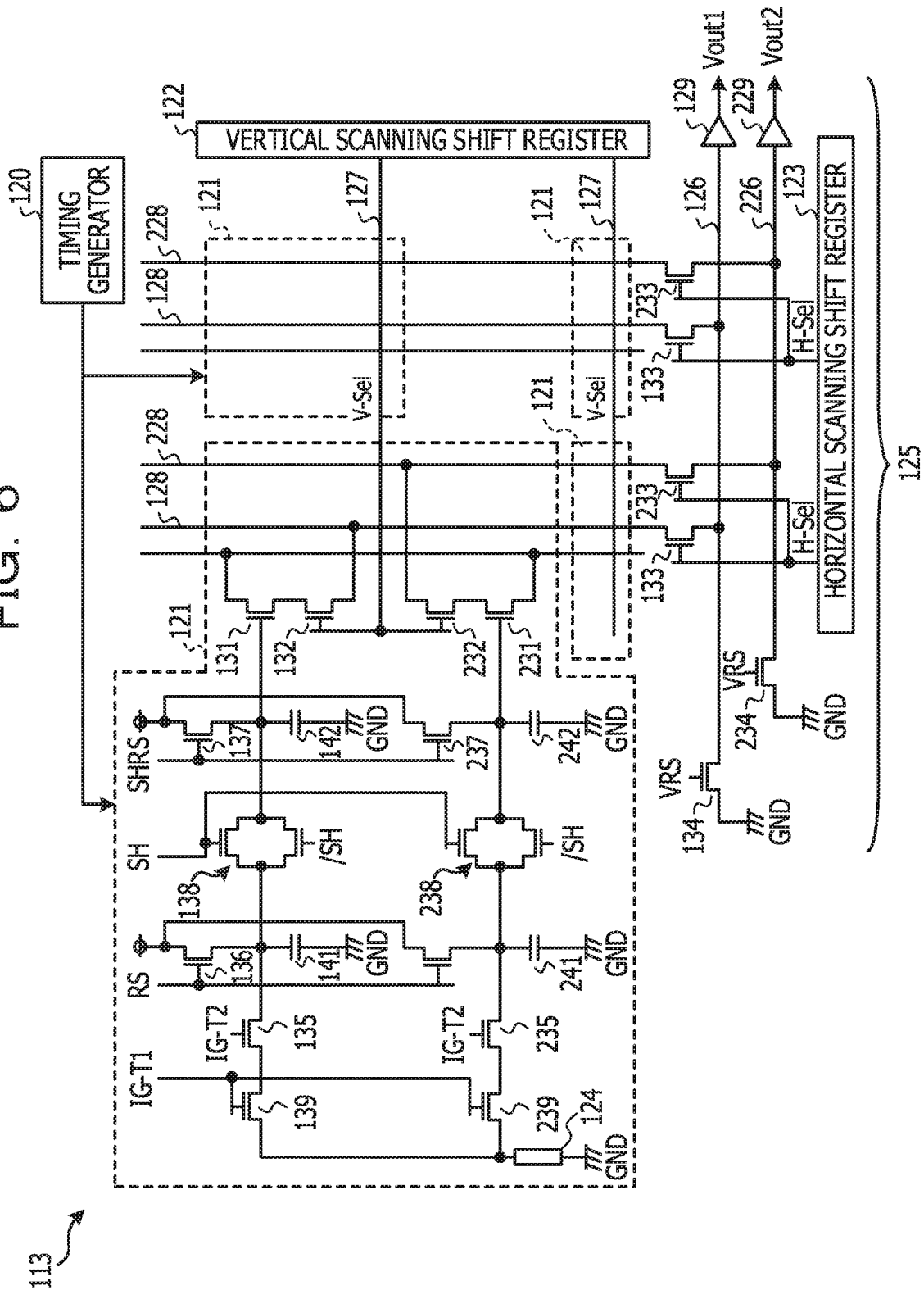
FIG. 6 is a diagram illustrating an example of the configuration of a CMOS reading circuit.

FIG. 6 is a diagram illustrating an example of the configuration of a CMOS reading circuit 113 according to an embodiment. The CMOS reading circuit 113 includes a plurality of pixel circuits 121 and a scan circuit 125.

The scan circuit 125 includes a plurality of scan lines 127 that extend in parallel in the horizontal direction (row direction), and a plurality of vertical bus lines 128 that extend in parallel in the vertical direction (column direction), a vertical scanning shift register 122, and a horizontal scanning shift register 123.

Figure 1:
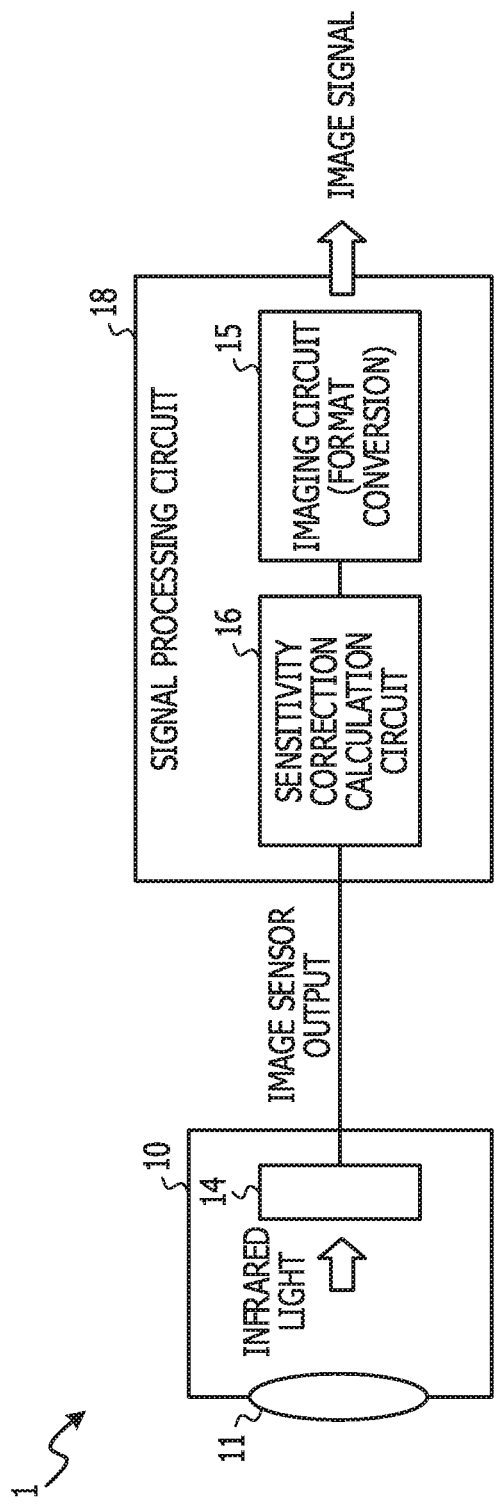
FIG. 1 is a diagram illustrating an example of the configuration of an infrared imaging apparatus using an infrared image sensor.
Figure 2:
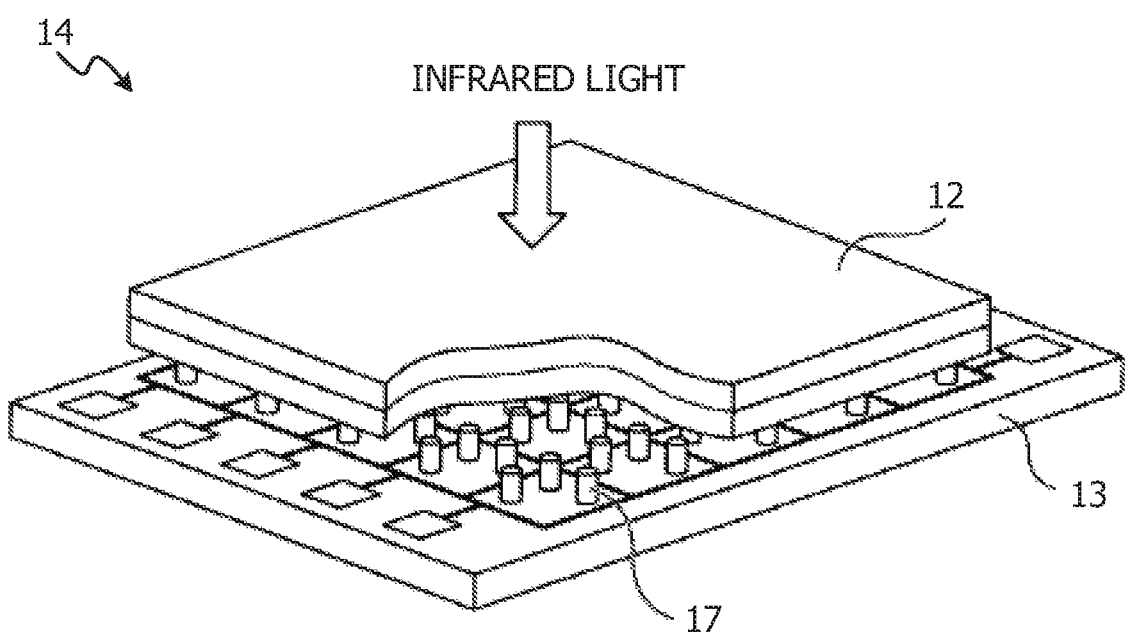
FIG. 2 is a diagram illustrating an example of the configuration of the infrared image sensor.
Figure 3:
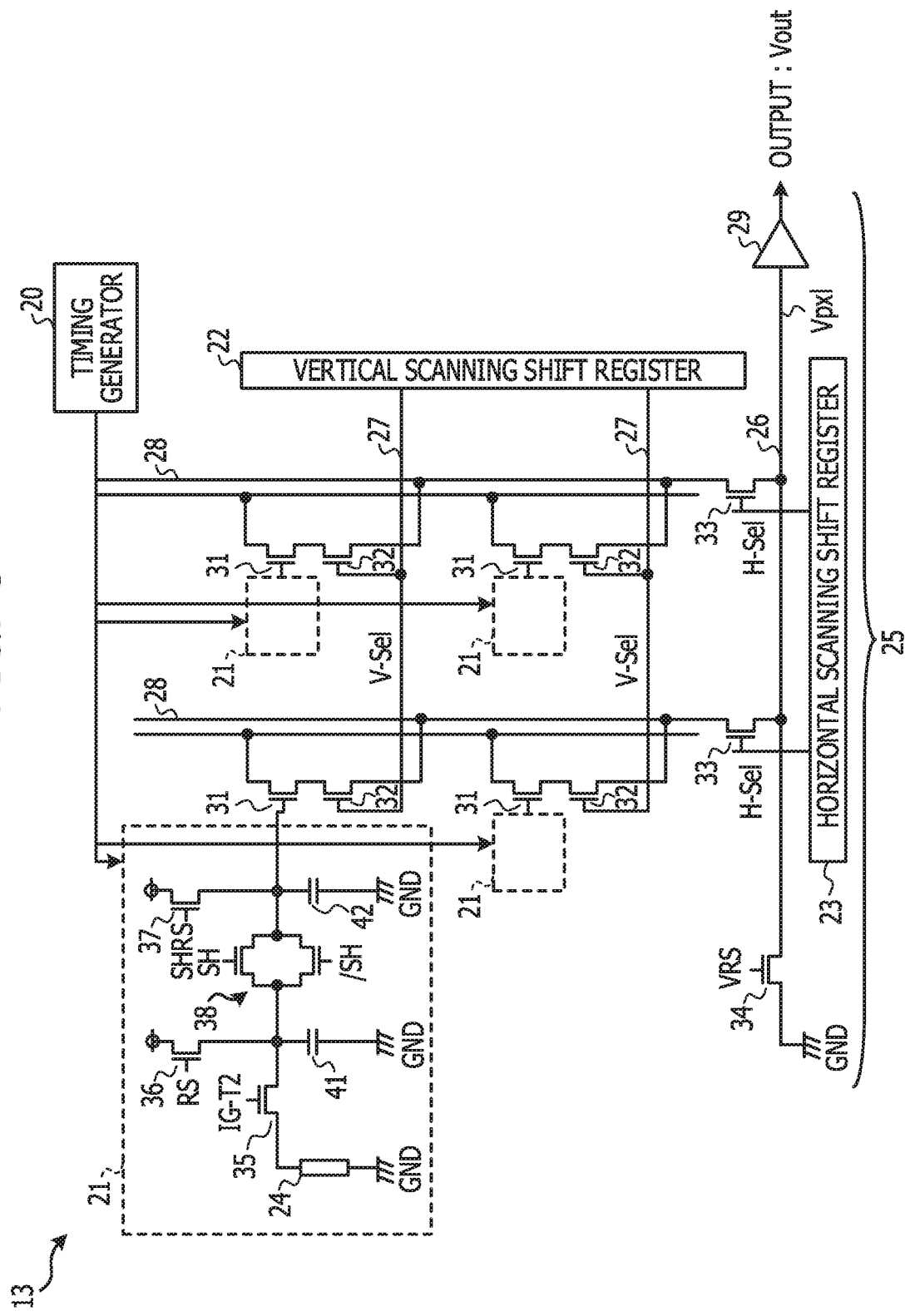
FIG. 3 is a diagram illustrating an example of the configuration of a CMOS reading circuit.
Figure 4:
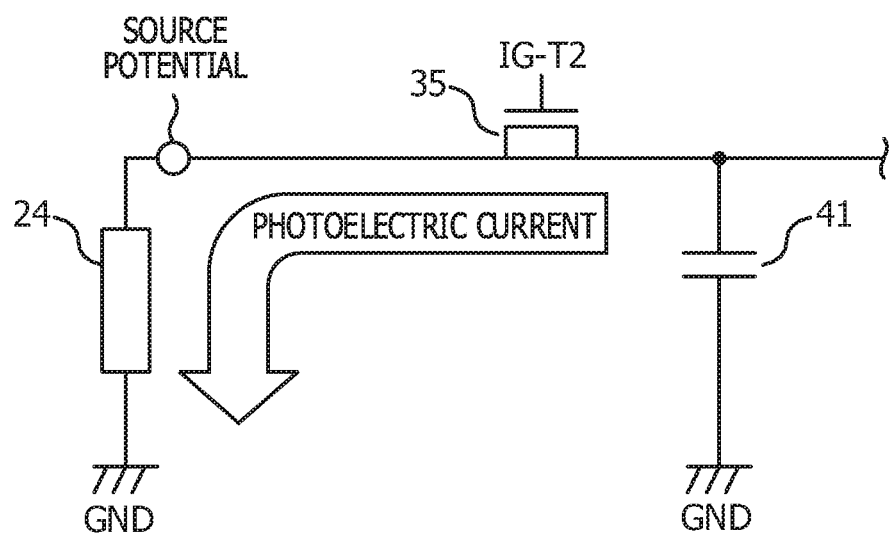
FIG. 4 is a diagram illustrating a part of the configuration of a pixel circuit.
Figure 5:
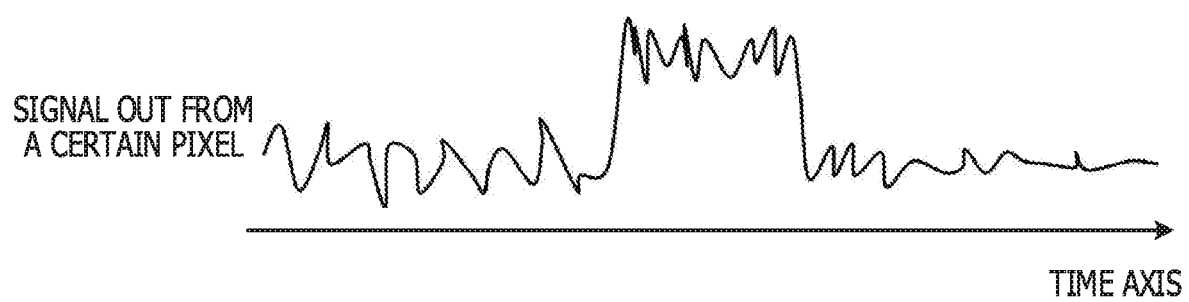
FIG. 5 is a diagram illustrating an example of fluctuations of a pixel output voltage.

The pixel circuits 121 are disposed in a matrix state correspondingly to the individual intersecting units of the plurality of scan lines 127 and the plurality of vertical bus lines 128. A sensor element 124 in the pixel circuit 121 illustrates a sensor element (cell) disposed in a sensor array in the same manner as the infrared image sensor 14 illustrated in FIG. 2. The pixel circuit 121 illustrated in FIG. 6 is disposed for each of the plurality of sensor elements 124. The sensor element 124 is a photoconductive element having a characteristic of changing the resistance value in accordance with the amount of incident infrared light. Each of the pixel circuits 121 has the same configuration with each other.

In the CMOS reading circuit 113, a plurality of output systems are dispose for a common sensor element 124. In the configuration in FIG. 6, two output systems, each of which includes an input gate unit and subsequent units, coupled to one sensor element 124 are disposed.

The two output systems include input gate units respectively. The first input gate unit includes a transistor 139 coupled to the sensor element 124, and a transistor 135 coupled to the sensor element 124 via the transistor 139 and in series with the transistor 139. The second input gate unit includes a transistor 239 couple to the sensor element 124, and a transistor 235 coupled to the sensor element 124 via the transistor 239 and in series with the transistor 239.

In the input gate unit, a common gate line is coupled to each gate electrode of the transistors 139 and 239 that control a bias voltage of the sensor element 124, and a common fixed gate drive signal IG-T1 is applied to the common gate line. That is to say, the voltage applied to both ends of the sensor element 124 by the transistors 139 and 239 is set to the same bias voltage.

On the other hand, in the input gate unit, each of the gate electrodes of the transistors 135 and 235 that control a time period for allowing a current to flow through the sensor element 124 (time period during which charges are discharged from storage capacitors 141 and 241) is coupled to a gate line different with each other. An integration signal, which is an independent gate drive signal, is applied to each of the gate electrodes. An integration signal IG1-T2 is applied to the gate electrode of one transistor 135, and an integration signal IG2-T2 is applied to the gate electrode of the other transistor 235. That is to say, the transistors 135 and 235 are set to be opened and closed during different periods with each other, and thus it is possible for the transistors 139 and 239 to allow a current to flow through the sensor element 124 during different periods with each other.

Also, the two output systems individually have a sample-and-hold unit. The first sample-and-hold unit includes transistors 136 and 137, a transfer gate 138, a storage capacitor 141, and a sample-and-hold capacitor 142. The transfer gate 138 is an example of a sample-and-hold switch circuit disposed between the storage capacitor 141 and the sample-and-hold capacitor 142. The second sample-and-hold unit includes transistors 236 and 237, a transfer gate 238, a storage capacitor 241, and a sample-and-hold capacitor 242. The transfer gate 238 is an example of a sample-and-hold switch circuit disposed between the storage capacitor 241 and the sample-and-hold capacitor 242.

Figure 7:
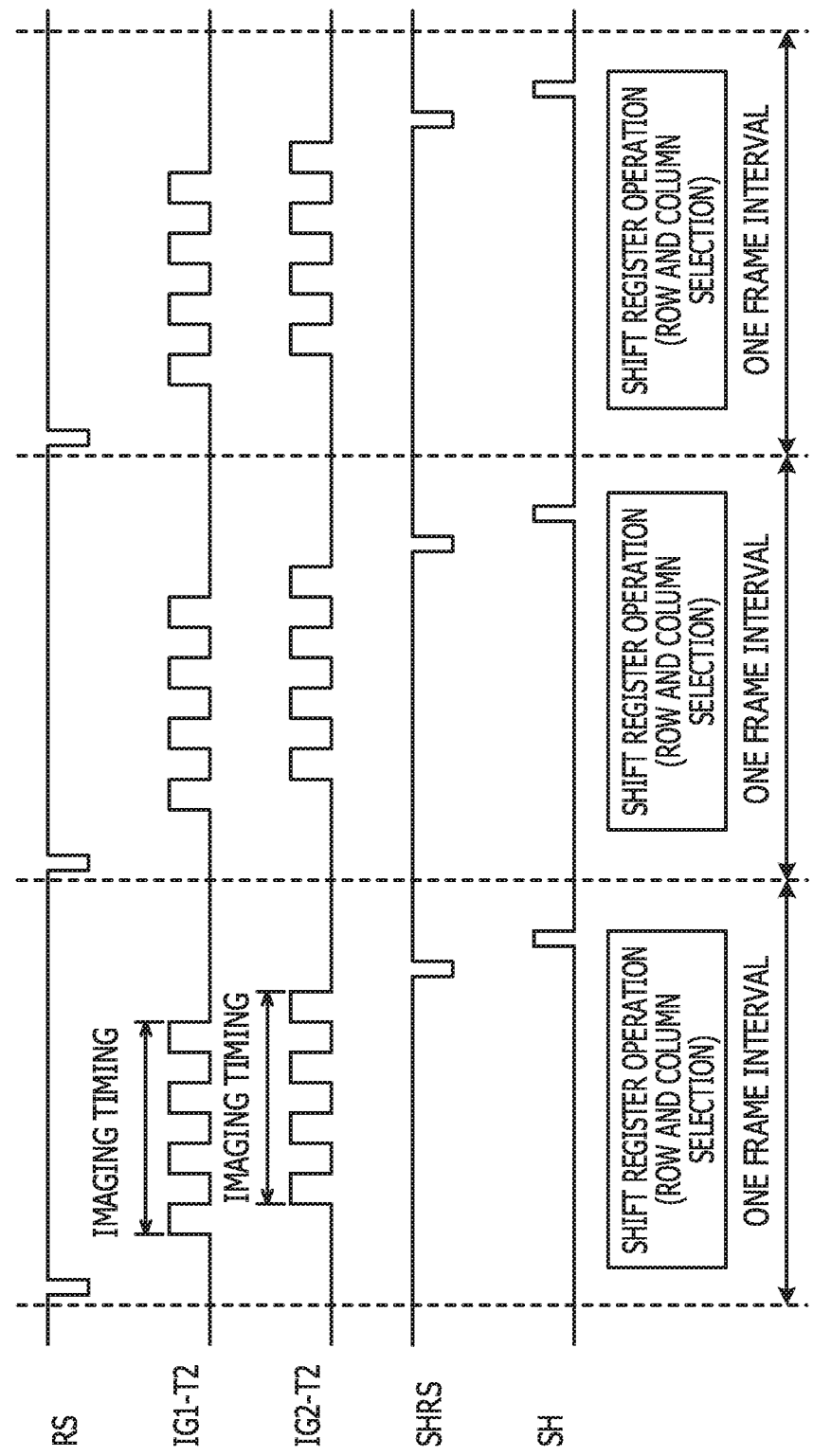
FIG. 7 is a timing chart illustrating an example of operation of the pixel circuit.

FIG. 7 is a timing chart illustrating an example of operation of the pixel circuit 121. A description will be given of FIG. 7 below with reference to FIG. 6.

The common fixed gate drive signal IG-T1 is applied to the transistors 139 and 239 all the time so that the transistors 139 and 239 are turned on all the time and perform no pulse operation. First, the common reset signal RS is applied to the reset gate transistors 136 and 236, and thus the transistors 136 and 236 become conductive so that the storage capacitor 41 is charged with a predetermined value. The transistors 136 and 236 are P-channel type MOS transistors, and thus become on (open) while the reset signal RS is at a low level.

After the application of the reset signal RS is stopped, the input gate transistors 135 and 235 are alternately opened and closed in accordance with the integration signals IG1-T2 and IG2-T2. Opening and closing the transistors 135 and 235 are repeated at least two times in one frame period. A current corresponding to the infrared light intensity of the sensor element 124 flows alternately through the storage capacitors 141 and 241, and thus the voltage of the storage capacitors 141 and 241 become the voltage corresponding to the infrared light intensity.

Next, the sample-and-hold reset transistors 137 and 237 become conductive in response to the common reset signal SHRS, and thus reset the voltage level of the reset sample-and-hold capacitors 142 and 242 to a predetermined value. The transistors 137 and 237 are P-channel type MOS transistors, and thus become on (open) while the reset signal SHRS is at a low level.

Next, the sample-and-hold signals SH and /SH are applied to the transfer gates 138 and 238, the voltage of the storage capacitor 141 is transferred to the sample-and-hold capacitor 142 and held, and the voltage of the storage capacitor 241 is transferred to the sample-and-hold capacitor 242 and held. The sample-and-hold signal /SH is the inverted signal of the sample-and-hold signal SH.

Such an operation is individually performed in a plurality of pixel circuits 121 at the same time for each one frame period, and thus the voltage corresponding to the infrared light intensity of each sensor element 124 is held in each of the sample-and-hold capacitors 142 and 242. In this manner, the sample-and-hold capacitor 142 stores the charge in accordance with the current that flows through the sensor element 124 via the transistors 135 and 139, and the sample-and-hold capacitor 242 stores the charge in accordance with the current that flows through the sensor element 124 via the transistors 235 and 239.

Also, in FIG. 6, the two output systems individually include an output unit. The first output unit includes a first amplification transistor 131, a first-row selection transistor 132, a first vertical bus line 128, a first-column selection transistor 133, a first reading line 126, and a first output stage amplifier 129. The second output unit includes a second amplification transistor 231, a second-row selection transistor 232, a second vertical bus line 228, a second-column selection transistor 233, a second reading line 226, and a second output stage amplifier 229.

Figure 8:
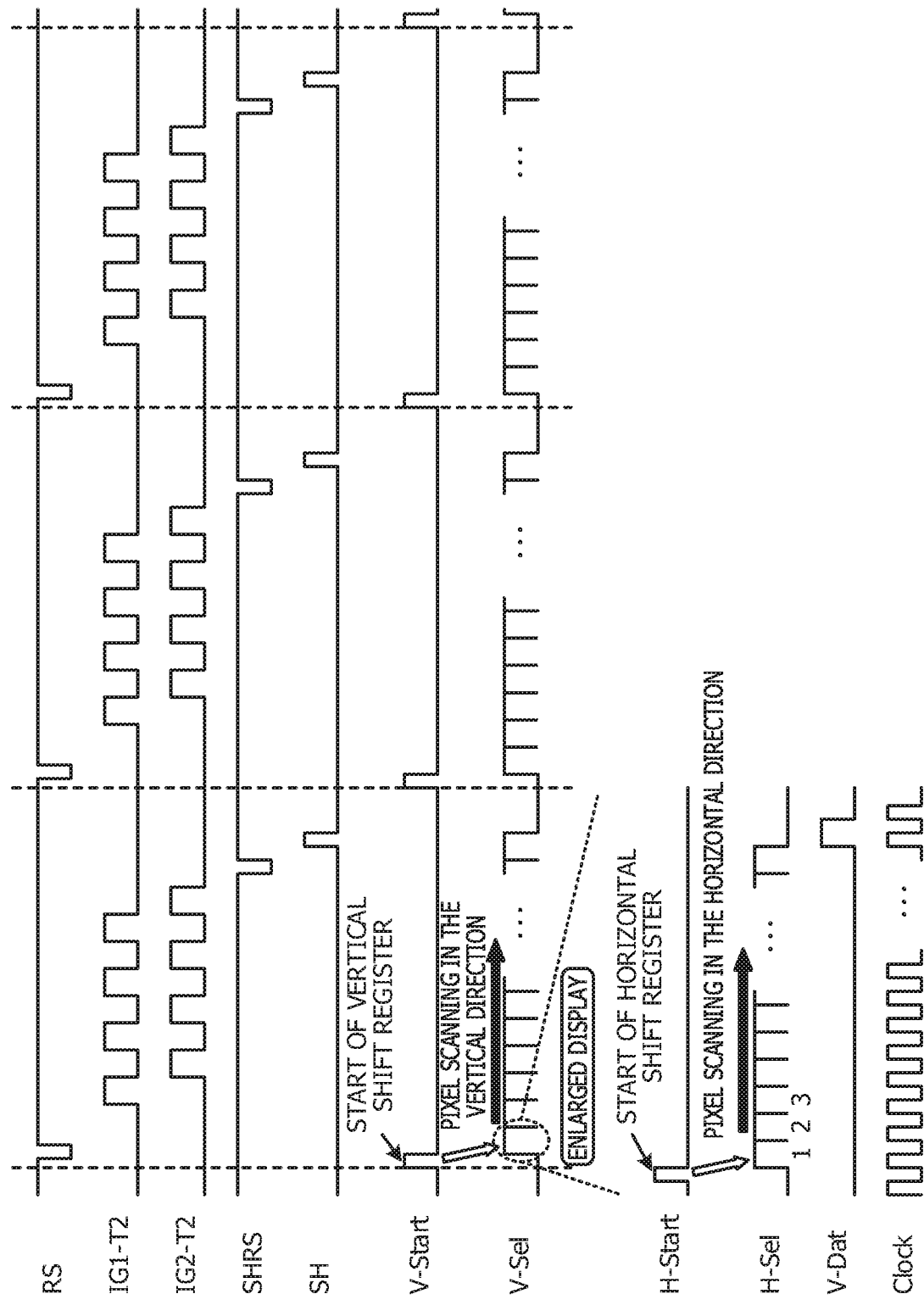
FIG. 8 is a timing chart illustrating an example of operation of a scan circuit.

FIG. 8 is a timing chart illustrating an example of operation of the scan circuit 125. A description will be given of FIG. 8 with reference to FIG. 6.

The signal voltage (pixel output voltage) of each pixel, which has been transferred to the sample-and-hold capacitors 142 and 242, is read in time series by changing the switches of the matrix by shift registers. The operation of the shift register is as follows.

The scanning by the vertical scanning shift register 122 is started by a pulse signal V-Start, and the scanning by the horizontal scanning shift register 123 is started by a pulse signal H-Start. While the row selection transistors 132 and 232 in the first row are turned on by a scan pulse V-Sel with the first selection by the vertical scanning shift register 122, the horizontal scanning shift register 123 counts up in sequence in response to a clock signal (Clock). Thereby, the column selection transistors 133 and 233 disposed in each column are selected by the reading pulse H-Sel of the horizontal scanning shift register 123 such that the first column, the second column, the third column are changed to on in sequence. The pixel selection is then performed by the horizontal scanning shift register 123 from the beginning column to the last column in the first row. After the last column in the first row is selected, the level of the rearmost selection signal V-Dat of the horizontal scanning shift register 123 becomes an active level.

By the rearmost selection signal V-Dat becoming the active level, the vertical scanning shift register 122 is caused to count up by one, and thus the vertical scanning shift register 122 changes to select the next second row. The pulse signal H-Start is given to the horizontal scanning shift register 123 again. While the row selection transistors 132 and 232 in the second row are turned on by a scan pulse V-Sel with the selection by the vertical scanning shift register 122, the horizontal scanning shift register 123 counts up in sequence in response to a clock signal (Clock). Thereby, the column selection transistors 133 and 233 disposed in each column are selected by the reading pulse H-Sel of the horizontal scanning shift register 123 such that the first column, the second column, the third column are changed to on in sequence. The pixel selection is then performed by the horizontal scanning shift register 123 from the beginning column to the last column in the second row. After the last column in the second row is selected, the level of the rearmost selection signal V-Dat of the horizontal scanning shift register 123 becomes the active level. This processing is performed until the selection of the last row.

Such shift register operations are repeated, and thus the scanning of the pixel selection is carried out in the vertical direction and the horizontal direction. Thereby the outputs of all the pixels are read in sequence. That is to say, the two time-series output signals Vout1 and Vout2 are output from the reading circuit 113. The output signals Vout1 and Vout2 are examples of the sensor signals. The transistors 134 and 234 become conductive in response to the common signal VRS, and reset the reading lines 126 and 226 to the ground level.

The timing control signal that operates the CMOS reading circuit 113, such as a reset signal RS, or the like is given from the timing generator 120. The timing generator 120 is disposed inside the reading circuit 113 or outside (for example, in a signal processing circuit 118 described later) the reading circuit 113.

Figure 9:
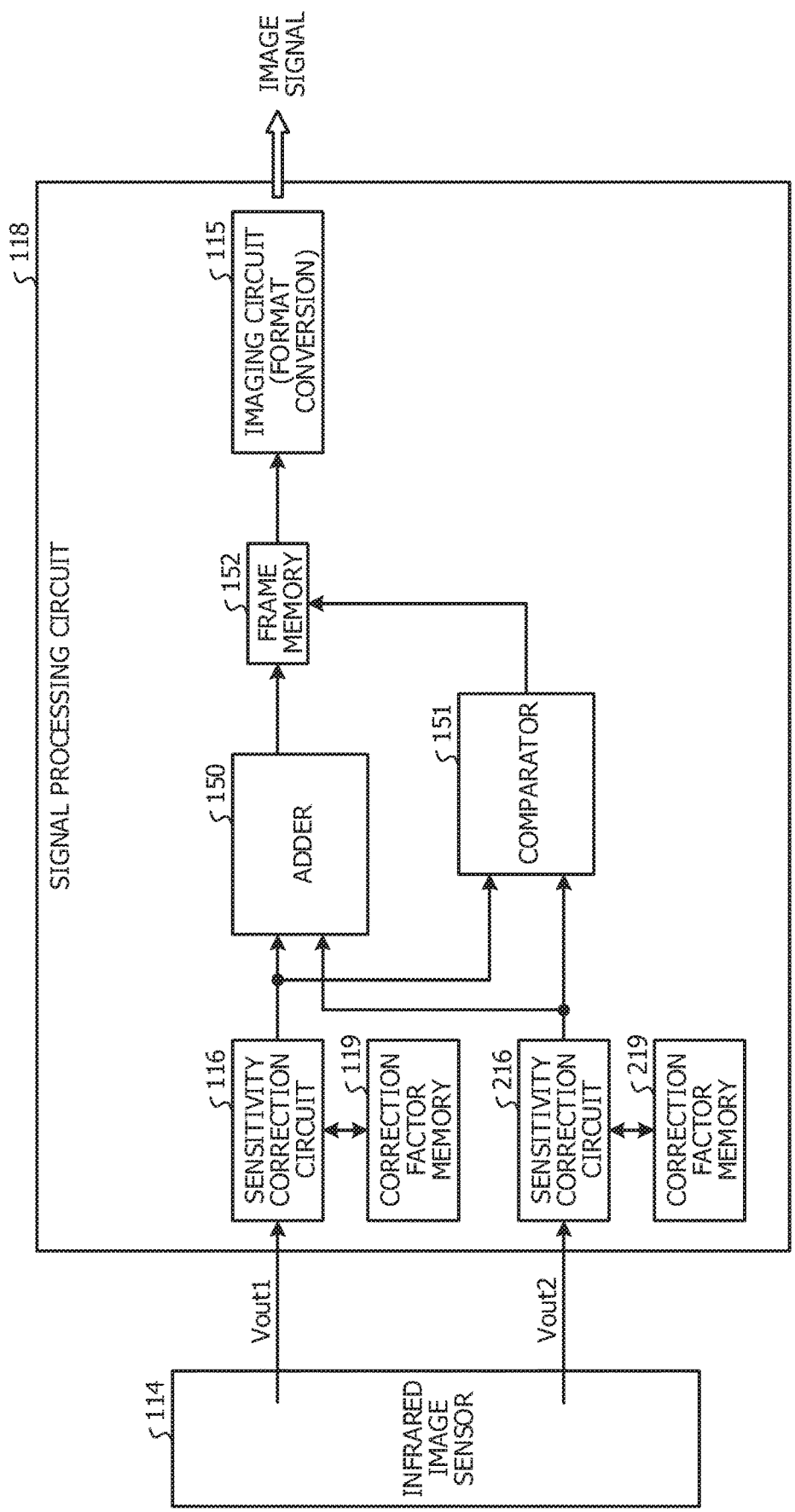
FIG. 9 is a diagram illustrating an example of the configuration of a signal processing unit.

FIG. 9 is a diagram illustrating an example of the configuration of the signal processing circuit 118. The signal processing circuit 118 is an example of a signal processing unit. The signal processing circuit 118 generates an image signal for generating a thermal image displayed on the display monitor from the two time-series output signals Vout1 and Vout2 that are output from the reading circuit 113 in the infrared image sensor 114.

The signal processing circuit 118 includes sensitivity correction circuits 116 and 216 that correct sensitivity variations of each pixel (each pixel circuit 121), and memories 119 and 219 that store correction factors for correcting the sensitivity variations of each pixel (each pixel circuit 121). The memory 119 stores a correction factor for correcting the output signal Vout1 read from the pixel circuit 121 including the sensor element 124 for each sensor element 124. The memory 219 stores a correction factor for correcting the output signal Vout2 read from the pixel circuit 121 including the sensor element 124 for each sensor element 124.

The sensitivity of each pixel of the infrared image sensor 114 varies by the influence of the difference in the photo responsive characteristic of the sensor element 124, the fluctuations of the drive bias to the sensor element 124 based on the characteristic differences of the transistors 139 and 239, and the like. In order to correct the sensitivity variations of each pixel, the sensitivity correction circuits 116 and 216 perform processing for multiplying each of the output signals Vout1 and Vout2 read in time series by a sensitivity correction factor for each one pixel. The gain value corresponding to the offset value to be reference for each pixel and the photo responsive sensitivity of each pixel are stored in the memories 119 and 219 as a correction factor. The sensitivity correction circuits 116 and 216 perform the correction calculation processing such that the same output (sensitivity) is obtained from each pixel with respect to uniform incident light using the correction factors read from the memories 119 and 219.

Also, the signal processing circuit 118 includes an adder 150, a comparator 151, a frame memory 152, and an imaging circuit 115.

The adder 150 adds the output signal Vout1 after the sensitivity correction performed by the sensitivity correction circuit 116 and the output signal Vout2 after the sensitivity correction performed by the sensitivity correction circuit 216. The comparator 151 compares the output signal Vout1 after the sensitivity correction performed by the sensitivity correction circuit 116 and the output signal Vout2 after the sensitivity correction performed by the sensitivity correction circuit 216. The frame memory 152 stores the addition result of the adder 150 in accordance with the comparison result of the comparator 151. The imaging circuit 115 performs format conversion on the infrared imaging signal (pixel output data) after the sensitivity correction, which has been read from the frame memory 152, to an image signal for generating a thermal image. The imaging circuit 115 outputs the image signal to the display monitor.

As illustrated in FIGS. 6 to 8 in the present embodiment, the timing generator 120 alternately drives the transistor 135 and the transistor 235 so as not turning on the transistor 135 and the transistor 235 in the same period. Thereby, the photoelectric current that flows through the sensor element 124 via the transistor 139 in the on state is integrated by the storage capacitor 141, and the photoelectric current that flows through the sensor element 124 via the transistor 239 in the on state is integrated by the storage capacitor 241. Since the bias voltage of the transistors 139 and 239 are set to the same voltage value, and thus substantially the same photoelectric current signals occur.

The opening and closing of the timing gates (the transistor 135 and the transistor 235) of the input gate unit are alternately repeated so that the integration time is subdivided in one frame period. The sum of the time period in which the transistor 135 is open and the sum of the time period in which the transistor 235 is open are set to match. The integration time (time period in which the shutter is open at imaging time) is repeated in a short period. Accordingly, it is possible to assume that the imaging timing (shutter opening period) determined by the transistor 135 and the imaging timing (shutter opening period) determined by the transistor 235 are substantially the same time (refer to FIG. 7). Accordingly, the individual outputs (the output signal Vout1 and the output signal Vout2) from the infrared image sensor 114 ought to be originally the same output result if the transistor 139 or the transistor 239 is not affected by noise, such as random telegraph noise.

The signal processing circuit 118 illustrated in FIG. 9 determines noise of the output signal Vout1 and the output signal Vout2, and generates an image signal. The signal processing circuit 118 performs sensitivity correction processing on Vout1 and Vout2 by the sensitivity correction circuits 116 and 216 respectively so as to reduce the sensitivity difference between the Vout1 after the correction and the Vout2 after the correction.

The single sensor element 124 is driven by the same bias, and the sensitivity differences of the output signal Vout1 and the output signal Vout2 ought to be substantially the same. However, a slight discrepancy sometimes occurs between the two output signals due to a small difference in the transistor characteristics and the characteristic difference of the output systems. The sensitivity correction processing is the processing in order to cancel such a sensitivity difference.

The signal processing circuit 118 reduces the sensitivity difference between Vout1 after the correction and Vout2 after the correction, then compares Vout1 after the correction and Vout2 after the correction using the comparator 151, and adds Vout1 after the correction and Vout2 after the correction using the adder 150.

Figure 10:
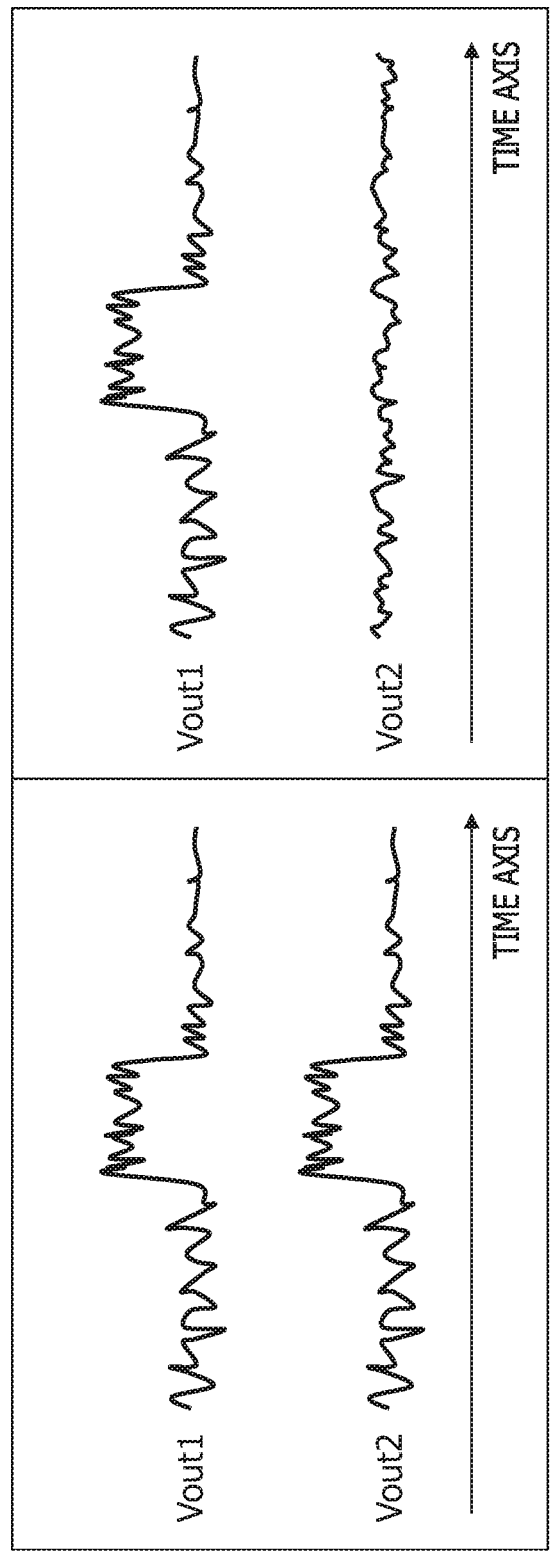
FIG. 10 is a diagram illustrating an example of changes of two output signals.

FIG. 10 is a diagram illustrating an example of changes of the output signals Vout1 and Vout2. If a change of the output signals Vout1 and Vout2 arise from the incident infrared light on the sensor element 124, Vout1 and Vout2 changes in phase with each other (refer to the left diagram in FIG. 10). On the other hand, if a change of the output signals Vout1 and Vout2 is caused by random telegraph noise, either one of Vout1 and Vout2 changes (refer to the right diagram in FIG. 10). This is because it is thought that the frequency of the occurrence of random telegraph noise in the two transistors 139 and 239 at the same time is very low.

Thus, in the signal processing circuit 118 illustrated in FIG. 9, if the comparator 151 determines that the Vout1 after the correction matches the Vout2 after the correction, it is possible to determine that random telegraph noise has not occurred. On the other hand, in the signal processing circuit 118, if the comparator 151 determines that the Vout1 after the correction does not match the Vout2 after the correction, it is possible to determine that random telegraph noise has occurred. That is to say, it is possible for the signal processing circuit 118 to determine whether the fluctuation of the output signal of the infrared image sensor 114 is due to a change in the incident wave, such as the incident infrared light on the sensor element 124 or due to noise, such as random telegraph noise.

In the signal processing circuit 118, for example, if the comparator 151 detects that the voltage difference between Vout1 after the correction and the Vout2 after the correction is smaller than or equal to a predetermined value, it is determined that Vout1 after the correction matches Vout2 after the correction. On the other hand, in the signal processing circuit 118, for example, if the comparator 151 detects that the voltage difference between Vout1 after the correction and the Vout2 after the correction is larger than the predetermined value, it is determined that Vout1 after the correction does not match Vout2 after the correction.

If the comparator 151 determines that Vout1 after the correction matches the Vout2 after the correction, the signal processing circuit 118 uses Vout1 after the correction and Vout2 after the correction to generate an image signal. For example, the signal processing circuit 118 records the added result by the adder 150 of Vout1 after the correction and the Vout2 after the correction in the frame memory 152, and transmits the pixel output data read from the frame memory 152 to the imaging circuit 115. The pixel output data after the addition in the previous imaging frame has been stored in the frame memory 152, and thus the signal processing circuit 118 updates the pixel output data in the previous imaging frame to the image output data in this time imaging frame.

On the other hand, if the comparator 151 determines that Vout1 after the correction does not match the Vout2 after the correction, the signal processing circuit 118 does not use Vout1 after the correction and Vout2 after the correction to generate an image signal. For example, if Vout1 after the correction does not match the Vout2 after the correction, the signal processing circuit 118 does not update the pixel output data in the frame memory 152. Thereby, the image signal generated based on the pixel output data having no random telegraph noise is output from the imaging circuit 115. If Vout1 after the correction does not match Vout2 after the correction (if determined that random telegraph noise has occurred), the imaging circuit 115 generates an image signal based on the image output data stored in the frame memory 152 before the noise occurred.

Accordingly, according to the present embodiment, Vout1 after the correction and Vout2 after the correction that do not match with each other are not used for generating an image signal, and Vout1 after the correction and Vout2 after the correction that match with each other are used for generating an image signal. Thereby, it is possible to reduce conspicuous disturbance of an image, such as a luminance change, or the like due to noise, such as random telegraph noise. Also, an image signal is generated based on the added result of the output of the transistor 135 produced in the open period and the output of the transistor 235 produced in the open period, and thus even if the open period for one transistor is short, it is possible to reduce the deterioration of the average signal-to-noise ratio of the entire image.

Next, a description will be given of a specific example of an imaging apparatus.

Figure 11:
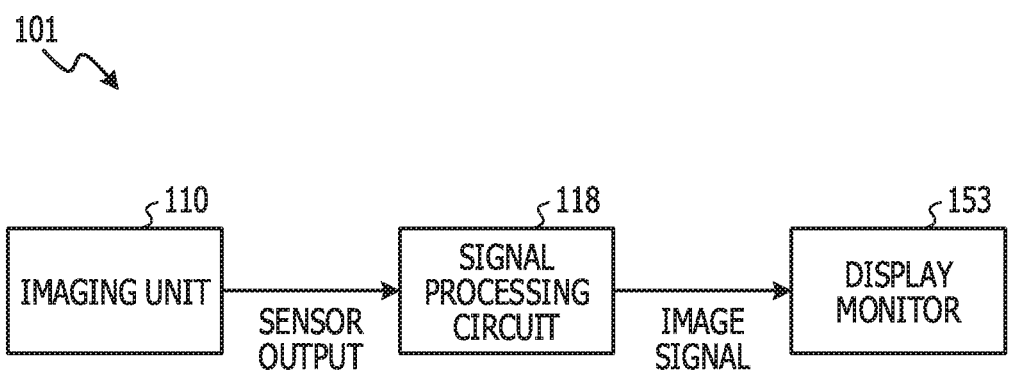
FIG. 11 is a diagram illustrating an example of the configuration of an infrared imaging apparatus.

FIG. 11 is a diagram illustrating an example of the configuration of an infrared imaging apparatus 101. The infrared imaging apparatus 101 includes an imaging unit 110, a signal processing circuit 118, and a display monitor 153. The infrared imaging apparatus 101 may not include the display monitor 153.

Figure 12:
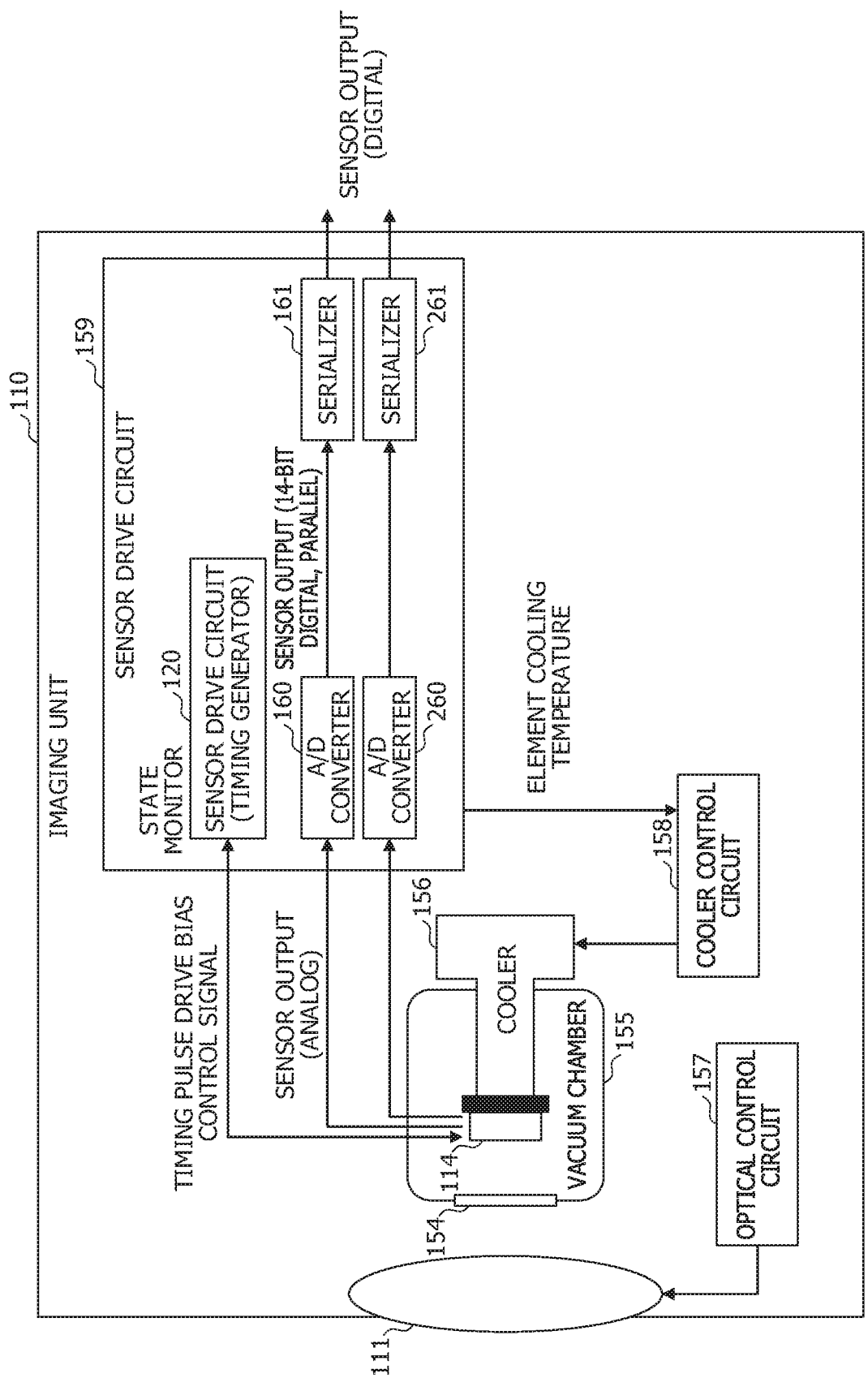
FIG. 12 is a diagram illustrating an example of the configuration of an imaging unit including an infrared image sensor.

FIG. 12 is a diagram illustrating an example of the configuration of an imaging unit 110 including the infrared image sensor 114. The infrared image sensor 114 includes a flip-chip bonded light receiving element array chip on the chip of the CMOS reading circuit 113 (refer to FIG. 6). The light receiving element array chip is a sensor array in which quantum well infrared photodetectors (QWIPs) are arranged in a two-dimensional array.

The infrared image sensor 114 is enclosed in a vacuum chamber 155. A cooler 156 cools the infrared image sensor 114 at 70 to 80K. An infrared light incident window 154 is attached to the tip of the vacuum chamber 155. The infrared light of an image formed by an optical system including a lens 111 disposed in front of the vacuum chamber 155 enters on the infrared image sensor 114 via the incident window 154. The focus position at which the lens 111 forms an image is adjusted to the incident surface of the infrared image sensor 114.

The imaging unit 110 includes a cooler control circuit 158 that keeps the cooling temperature of the infrared image sensor 114 at a fixed temperature and an optical control circuit 157 for performing focus adjustment of the lens 111.

The imaging unit 110 includes a sensor drive circuit 159 for driving the infrared image sensor 114. The sensor drive circuit 159 includes a timing generator 120 that supplies timing pulse signals (for example, a clock signal, a frame synchronization signal, a shift register control signal, and the like) to the CMOS reading circuit 113 of the infrared image sensor 114. The sensor drive circuit 159 supplies the operation power source of the CMOS reading circuit 113, the power source voltage of the internal amplifier of the CMOS reading circuit 113, the reset voltage, the bias voltages of the gate drive signal IG-T1, and the like to the CMOS reading circuit 113 of the infrared image sensor 114.

The sensor drive circuit 159 includes analog-to-digital (A/D) converters 160 and 260. The A/D converter 160 converts the analog output signal Vout1 from the CMOS reading circuit 113 into, for example, a 14-bit parallel digital output. The 14-line parallel digital output is converted by a serializer 161 into a time-series digital signal in one system, and the converted digital signal is output to the outside as the output signal Vout1. In the same manner, the A/D converter 260 converts the analog output signal Vout2 from the CMOS reading circuit 113 into, for example, a 14-bit parallel digital output. The 14-line parallel digital output is converted by a serializer 261 into a time-series digital signal in one system, and the converted digital signal is output to the outside as the output signal Vout2.

In this regard, in FIG. 12, the subsequent configuration of the A/D converters 160 and 260 is illustrated by two output systems. However, when the pixels in the two-dimensional array are read by dividing the array into a plurality of areas, there is a plurality of output channels from the CMOS reading circuit 113, and thus the number of A/D converters may be increased in accordance with the number of channels.

Figure 13:
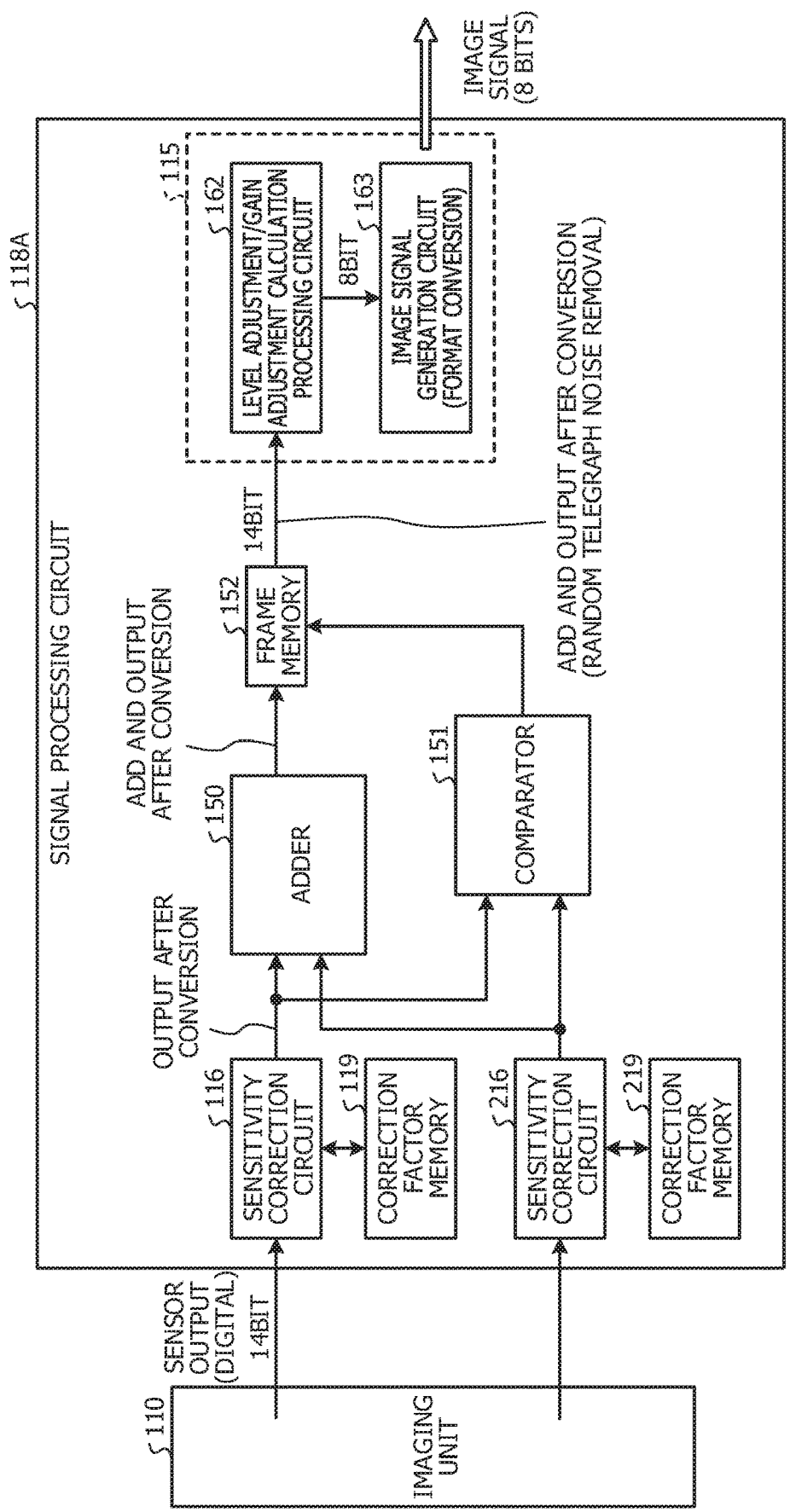
FIG. 13 is a diagram illustrating an example of the configuration of a signal processing unit.

FIG. 13 is a diagram illustrating an example of the configuration of a signal processing circuit 118A. The signal processing circuit 118A is the first example of the signal processing circuit 118. The signal processing circuit 118A performs signal processing on the output signal of the imaging unit 110.

The output signals Vout1 and Vout2, which are output from the infrared image sensor 114 in time series, have photo responsive sensitivity variations. The sensitivity correction circuits 116 and 216 correct the sensitivity variations. The sensitivity correction circuits 116 and 216 multiply the output signals Vout1 and Vout2 by correction factors stored in the memories 119 and 219, respectively, such that the output signals Vout1 and Vout2 with reference to a fixed amount of incident light to the sensor element 124 become the same with each other. The memory 119 stores the correction factor by which the output signal Vout1 is multiplied for each sensor element 124, and the memory 219 stores the correction factor by which the output signal Vout2 is multiplied for each sensor element 124.

The comparator 151 detects the difference between the output signal Vout1 after the sensitivity correction and the output signal Vout2 after the sensitivity correction, and determines whether or not random telegraph noise has occurred. Also, the adder 150 adds the output signal Vout1 after the sensitivity correction and the output signal Vout2 after the sensitivity correction to produce one output signal (pixel output data), and then records the pixel output data in the frame memory 152. The frame memory 152 stores the original signal to generate an image signal. When pixel output data is updated, the data update is performed in accordance with the flowchart illustrated in FIG. 14.

Figure 14:
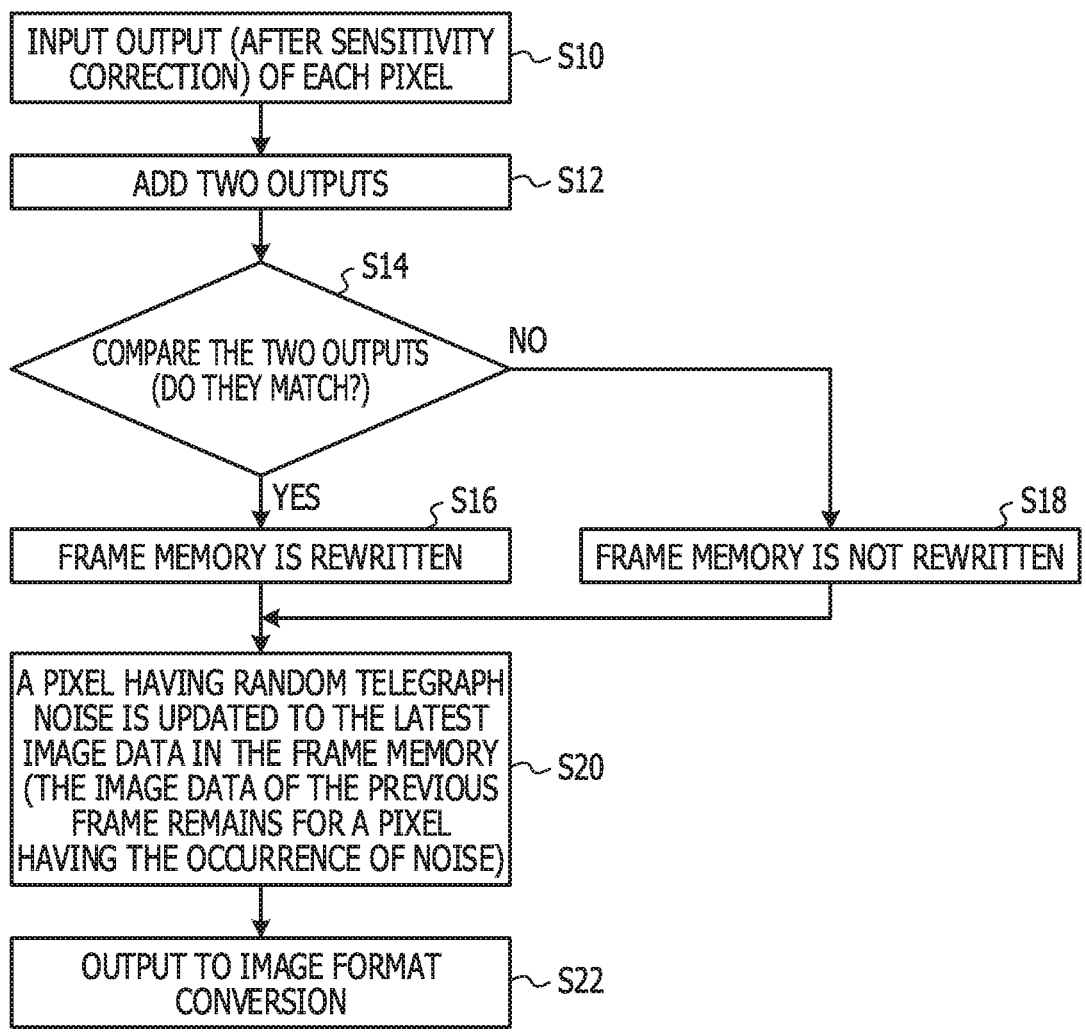
FIG. 14 is a flowchart illustrating an example of the handling procedure of random telegraph noise.

FIG. 14 is a flowchart illustrating an example of the handling procedure of random telegraph noise.

In step S10, the sensitivity correction circuits 116 and 216 individually output the output signals Vout1 and Vout2 after sensitivity correction to the adder 150 and the comparator 151.

In step S12, the adder 150 adds the output signals Vout1 and Vout2 that have been input.

In step S14, the comparator 151 determines whether or not the output signals Vout1 and Vout2, which have been input, match with each other. If the comparator 151 determines that the output signals Vout1 and Vout2, which have been input, match with each other, the adder 150 rewrites the pixel output data that is already stored in the frame memory 152 with the pixel output data indicating the addition result of this time in step S12 (step S16). On the other hand, if the comparator 151 determines that the output signals Vout1 and Vout2 do not match, the adder 150 does not rewrite the pixel output data that is already stored in the frame memory 152 with the pixel output data indicating the addition result of this time in step S12.

Thereby, in step S20, for the pixel that has been determined to have no random telegraph noise, the pixel output data in the frame memory 152 is updated to the latest data. For the pixel that has been determined to have random telegraph noise, the pixel output data of the previous frame of before is held as the pixel output data in the frame memory 152.

In step S22, the pixel output data in the frame memory 152 is output to the imaging circuit 115.

In FIG. 13, the imaging circuit 115 generates an image signal using the pixel output data stored in the frame memory 152 for each sensor element 124. The pixel output data stored in the frame memory 152 is the data obtained by adding the 14-bit signals of the output signals Vout1 and Vout2 after sensitivity correction of the infrared image sensor 114.

If the display monitor 153 performs monitor output with grayscale representation having 256 grayscales, the adjustment circuit 162 converts the 14-bit pixel output data into 8-bit pixel output data. The original 14-bit pixel output data has the information corresponding to the entire output range of the infrared image sensor 114. The adjustment circuit 162 does not perform monitor output of the entire output range with black-and-white grayscale representation to the display monitor 153, but cuts out part of the entire output range, and performs monitor output of the cut range with black-and-white display to the display monitor 153. The adjustment circuit 162 adjusts the width of the cutting with a specified point as center of the entire output range in order to generates 8-bit pixel output data.

The adjustment circuit 162 performs level adjustment that determines the median at the time of cutting out, and adjusts the brightness of the entire screen when displaying an imaging result by performing the level adjustment. On the other hand, the adjustment circuit 162 performs gain adjustment that determines the width of the cutting, and adjusts the contrast of the screen display by performing the gain adjustment.

The image signal generation circuit 163 performs format conversion processing that converts the 8-bit image output data generated by the adjustment circuit 162 into a data array in accordance with the display format of the display monitor 153, or the like, and outputs the image signal after having been subjected to the format conversion processing to the display monitor 153.

In FIG. 13 and FIG. 14, the handling of random telegraph noise is realized by switching data update in the frame memory 152. However, the handling method is not limited to this.

Figure 15:
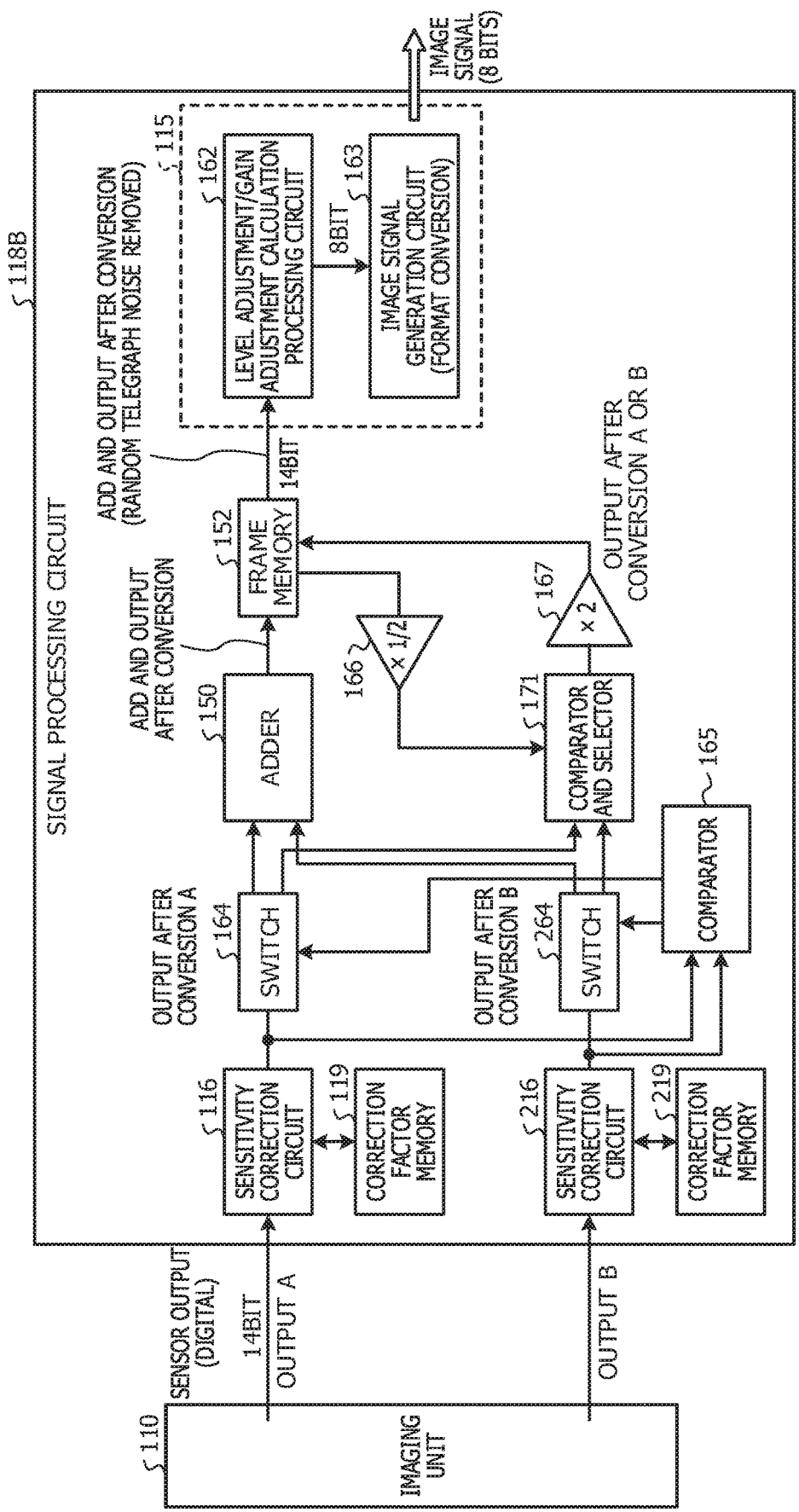
FIG. 15 is a diagram illustrating an example of the configuration of a signal processing unit.
Figure 16:
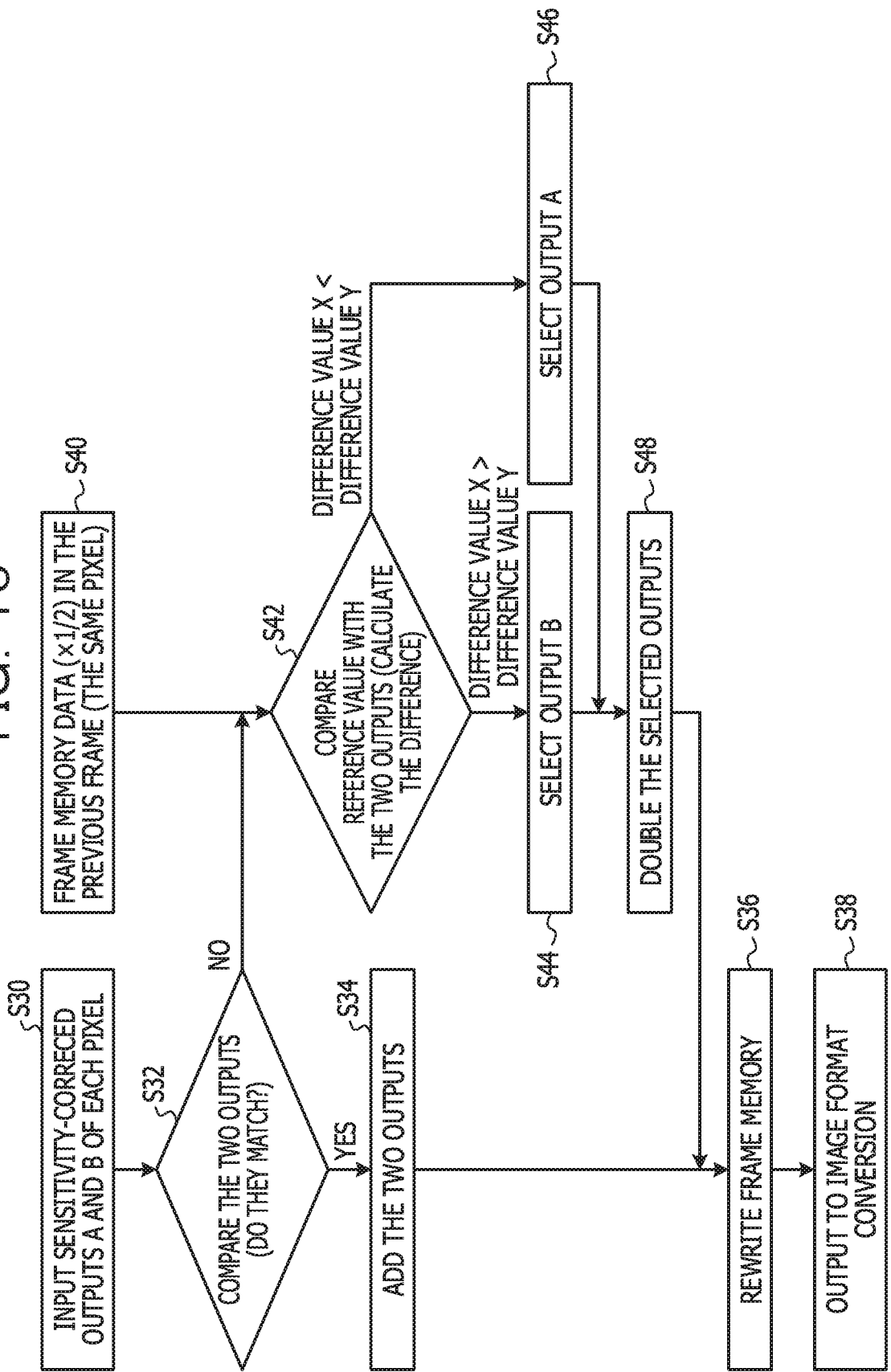
FIG. 16 is a flowchart illustrating an example of the handling procedure of random telegraph noise.

FIG. 15 is a diagram illustrating an example of the configuration of a signal processing circuit 118B. FIG. 16 is a flowchart illustrating an example of the handling procedure of random telegraph noise by the signal processing circuit 118B. The signal processing circuit 118B is the second example of the signal processing circuit 118. For the same configuration as described above, the above-described description will be quoted and thus its description will be omitted. A description will be given of the configuration in FIG. 15 in comparison with each processing step illustrated in FIG. 16.

In FIG. 15, the sensitivity correction circuit 116 performs sensitivity correction on the sensor output A (output signal Vout1) sent from the imaging unit 110, and the sensitivity correction circuit 216 performs sensitivity correction on the sensor output B (output signal Vout2) sent from the imaging unit 110. The sensitivity correction circuits 116 and 216 output the sensor outputs A and B after sensitivity correction to the comparator 165 (step S30). The comparator 165 compares the sensor outputs A and B after sensitivity correction in order to determine whether or not the outputs match with each other (step S32).

If determined that the sensor outputs A and B match from the comparison result by the comparator 165 (if determined that random telegraph noise has not occurred), the switches 164 and 264 outputs the corrected sensor outputs A and B to the adder 150. The adder 150 adds the sensor outputs A and B, which have been input (step S34), and records the addition result to the frame memory 152 (step S36).

On the other hand, If determined that the sensor outputs A and B do not match from the comparison result by the comparator 165 (if determined that random telegraph noise has occurred), the switches 164 and 264 outputs the corrected sensor outputs A and B to the comparator and selector 171.

The comparator and selector 171 pulls in the pixel output data of the frame just before (for example, the previous frame) from the frame memory 152 (step S40). At this time, since the pixel output data in the frame memory 152 is the added value of the sensor output A and the sensor output B, the comparator and selector 171 pulls in a value half the added value, produced by a divider 166, as a reference value. The comparator and selector 171 individually compares the pulled reference value with the two corrected sensor outputs A and B for each same pixel (step S42).

The comparator and selector 171 compares a difference value X and a difference value Y. The difference value X denotes a value produced by subtracting the reference value from the corrected sensor output A, and the difference value Y denotes a value produced by subtracting the reference value from the corrected output B. It is possible for the comparator and selector 171 to estimate that the sensor output having a smaller value between the difference value X and the difference value Y is not affected by random telegraph noise. This is because it is possible to assume that the smaller a change in the pixel output data of before-and-after frames, the smaller the possibility of the occurrence of random telegraph noise.

The comparator and selector 171 selects the sensor output having a smaller value out of the difference value X and the difference value Y as a sensor output that is usable for generating an image signal. If the difference value X is larger than the difference value, the comparator and selector 171 selects the corrected sensor output B, and if the difference value X is smaller than the difference value Y, the comparator and selector 171 selects the corrected sensor output A.

The sensor output selected by the comparator and selector 171 is multiplied by two by a multiplier 167 in order to adjust the level to that of the added value in the frame memory 152 (step S48), and is stored in the frame memory 152.

In step S38, the pixel output data in the frame memory 152 is output to the imaging circuit 115. The processing for generating an image signal from the pixel output data in the frame memory 152 is the same as described above.

Figure 17:
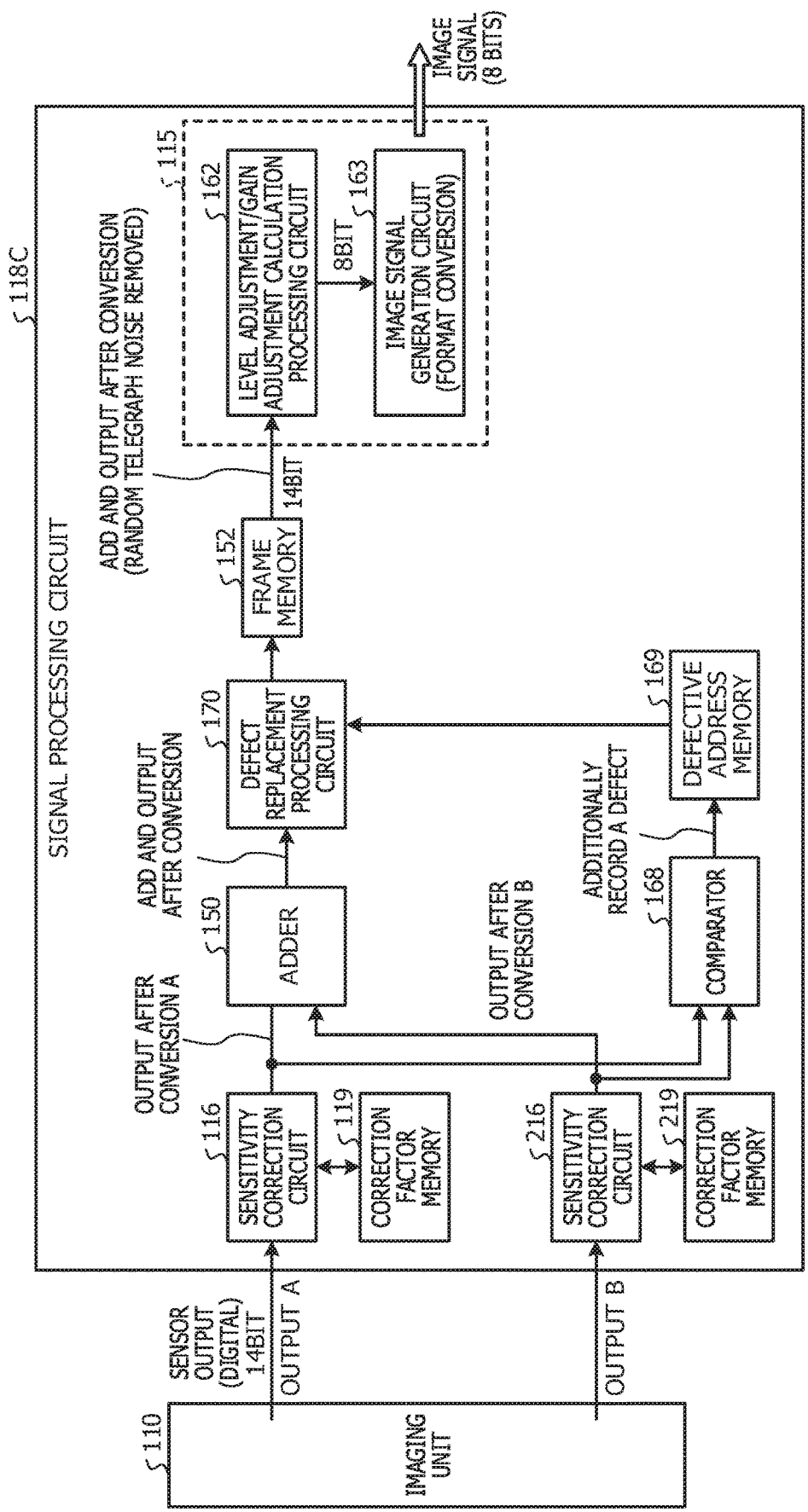
FIG. 17 is a diagram illustrating an example of the configuration of a signal processing unit.
Figure 18:
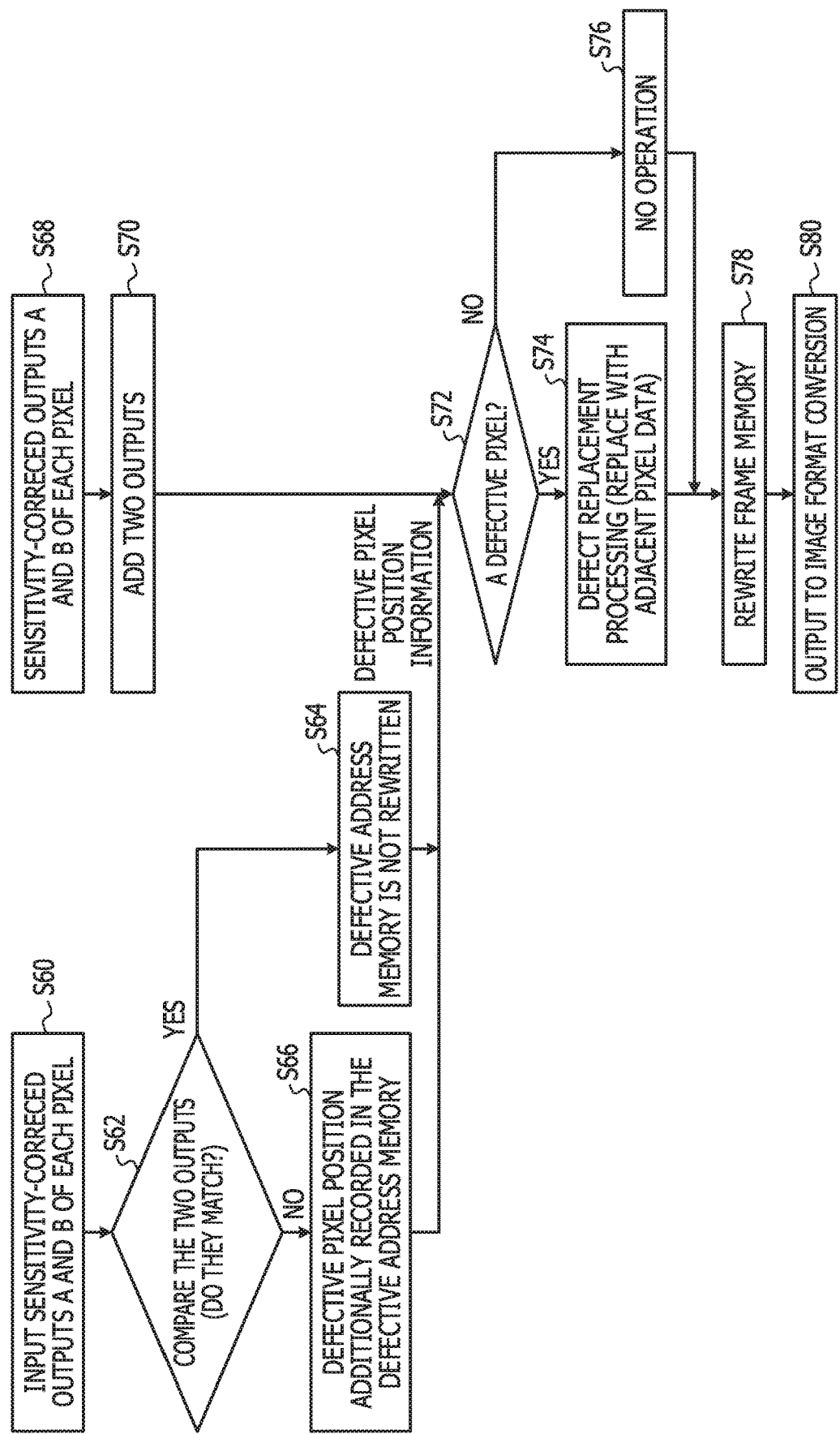
FIG. 18 is a flowchart illustrating an example of the handling procedure of random telegraph noise.

FIG. 17 is a diagram illustrating an example of the configuration of a signal processing circuit 118C. FIG. 18 is a flowchart illustrating an example of the handling procedure of random telegraph noise by the signal processing circuit 118C. The signal processing circuit 118C is the third example of the signal processing circuit 118. For the same configuration as described above, the above-described description will be quoted and thus its description will be omitted. A description will be given of the configuration in FIG. 17 in comparison with each processing step illustrated in FIG. 18.

In FIG. 17, the sensitivity correction circuit 116 performs sensitivity correction on the sensor output A (output signal Vout1) sent from the imaging unit 110, and the sensitivity correction circuit 216 performs sensitivity correction on the sensor output B (output signal Vout2) sent from the imaging unit 110. The sensitivity correction circuits 116 and 216 output the sensor outputs A and B after sensitivity correction to the comparator 168 (step S60). The comparator 168 compares the sensor outputs A and B after sensitivity correction in order to determine whether or not the outputs match with each other (step S62).

If determined that the sensor outputs A and B do not match from the comparison result by the comparator 168, the comparator 168 determines that a pixel (sensor element 124) whose sensor outputs A and B do not match is defective. The comparator 168 additionally records the position information of the pixel determined as defective in the defective address memory 169 (step S66).

On the other hand, if determined that the sensor outputs A and B match from the comparison result by the comparator 168, the comparator 168 determines that there are no defective pixels. If determined that there are no defective pixels, the comparator 168 does not rewrite the defective address memory 169 (step S64).

On the other hand, in step S68, the sensitivity correction circuits 116 and 216 output the sensor outputs A and B after sensitivity correction to the adder 150. In step S70, the adder 150 adds the sensor output A and the sensor output B that are input.

The defect replacement processing circuit 170 determines whether or not the position information of the pixel whose added value by the adder 150 is included in the position information recorded in the defective address memory 169 so as to determine whether or not the pixel is a defective pixel (step S72).

If the position information of the pixel whose added value by the adder 150 is included in the position information recorded in the defective address memory 169, the defect replacement processing circuit 170 determines that the pixel is a defective pixel. The defect replacement processing circuit 170 assumes that the pixel output data of adjacent pixels are close to each other, and replaces the pixel output data of the pixel determined to be a defective pixel with the pixel output data of a normal pixel adjacent to the defective pixel (step S74). Thereby, it is possible to temporarily use the pixel output data of the normal pixel in place of the pixel output data of the defective pixel. The defect replacement processing circuit 170 rewrites the pixel output data that is already stored in the frame memory 152 by the substitute pixel output data (step S78).

On the other hand, if the position information of the pixel whose added value by the adder 150 is not included in the position information recorded in the defective address memory 169, the defect replacement processing circuit 170 does not perform replacement processing (step S76). The defect replacement processing circuit 170 rewrites the pixel output data that is already stored in the frame memory 152 by the pixel output data indicating the addition result at this time in step S70 (step S78).

In this manner, if the comparator 168 determines that there is a pixel whose sensor outputs A and B do not match, the comparator 168 determines that random telegraph noise has occurred in the pixel, and records the position information of the pixel in which random telegraph noise has occurred in the defective address memory 169. At the time of generating an image signal, the defect replacement processing circuit 170 refers to the defective address memory 169. If a defective pixel is detected, the defect replacement processing circuit 170 performs processing for replacing the pixel output data of the defective pixel with the pixel output data of an adjacent normal pixel. This replacement processing reduces the influence of random telegraph noise.

In step S80, the pixel output data in the frame memory 152 is output to the imaging circuit 115. The processing for generating an image signal from the pixel output data of the frame memory 152 is the same as described above.

In the above, a description has been given of the imaging apparatus by the embodiments. However, the present disclosure is not limited to the embodiment described above. It is possible to make various variations and improvements, such as combination or replacement of a part of or all of the other embodiments within the scope of the present disclosure.

For example, the number of output systems subsequent to the input gate unit coupled to the sensor element is not limited to two, and may be three or more.

Also, the observation target of the sensor element is not limited to infrared light, and may be the other electromagnetic waves, such as visible light, ultraviolet light, X-ray, or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An imaging apparatus comprising:
    an image sensor including a sensor element, a first output system coupled to the sensor element, and a second output system coupled to the sensor element; and
    a signal processing circuit that generates an image signal from outputs of the image sensor,
    wherein the first output system includes
        a first transistor coupled to the sensor element and having a first control terminal to which a drive signal is input,
        a first capacitor that stores charge in accordance with a current flowing through the sensor element via the first transistor,
        a third transistor coupled between the first transistor and the first capacitor and having a third control terminal to which a first integration signal is input, and
        first output circuitry that outputs a first sensor signal in accordance with a voltage of the first capacitor to the signal processing circuit,
    wherein the second output system includes
        a second transistor coupled to the sensor element and having a second control terminal to which the drive signal is input,
        a second capacitor that stores charge in accordance with a current flowing through the sensor element via the second transistor,
        a fourth transistor coupled between the second transistor and the second capacitor and having a fourth control terminal to which a second integration signal is input, and
        second output circuitry that outputs a second sensor signal in accordance with a voltage of the second capacitor to the signal processing circuit,
    wherein the first transistor and the second transistor allows the current of the sensor element to flow in time periods different with each other, and
    the signal processing circuit does not generate the image signal if the first sensor signal and the second sensor signal do not match with each other, and
    the signal processing circuit generates the image signal if the first sensor signal and the second sensor signal match with each other.

2. The imaging apparatus according to claim 1,
    wherein if the first sensor and the second sensor signal match with each other, the signal processing circuit adds the first sensor and the second sensor signal with each other for generating the image signal.

3. The imaging apparatus according to claim 1,
    wherein the first transistor and the second transistor individually allow the currents to flow by turns.

\* \* \* \* \*